(12) United States Patent
Sarin et al.

(10) Patent No.: US 7,577,036 B2
(45) Date of Patent: Aug. 18, 2009

(54) NON-VOLATILE MULTILEVEL MEMORY CELLS WITH DATA READ OF REFERENCE CELLS

(75) Inventors: Vishal Sarin, Cupertino, CA (US); Jung Sheng Hoei, Newark, CA (US); Frankie F. Roohpavar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 11/799,658

(22) Filed: May 2, 2007

(65) Prior Publication Data

US 2008/0273384 A1    Nov. 6, 2008

(51) Int. Cl.
*G11C 16/06* (2006.01)
(52) U.S. Cl. .............. 365/185.2; 365/185.03; 365/185.17; 365/185.22; 365/185.29
(58) Field of Classification Search .............. 365/185.2, 365/185.03, 185.17, 185.22, 185.29
See application file for complete search history.

(56) References Cited

U.S. PATENT DOCUMENTS

| 6,490,203 | B1 * | 12/2002 | Tang ................... 365/185.22 |
| 6,735,114 | B1 | 5/2004 | Hamilton et al. |
| 6,839,875 | B2 | 1/2005 | Roohparvar |
| 7,016,226 | B2 | 3/2006 | Shibata et al. |
| 7,120,060 | B2 * | 10/2006 | Pekny .................... 365/185.2 |
| 7,139,196 | B2 | 11/2006 | Tran |
| 7,369,433 | B2 * | 5/2008 | Toda .................... 365/185.03 |
| 2004/0255090 | A1 | 12/2004 | Guterman et al. |
| 2005/0237814 | A1 | 10/2005 | Li et al. |
| 2006/0242485 | A1 | 10/2006 | Roohparvar |
| 2007/0014161 | A1 | 1/2007 | Li et al. |

OTHER PUBLICATIONS

International Search Report (3 pgs.).

* cited by examiner

*Primary Examiner*—Connie C Yoha
(74) *Attorney, Agent, or Firm*—Brooks, Cameron & Huebsch, PLLC

(57) ABSTRACT

Embodiments of the present disclosure provide methods, devices, modules, and systems for non-volatile multilevel memory cell data retrieval with data read of reference cells. One method includes programming at least one data cell of a number of data cells coupled to a selected word line to a target data threshold voltage (Vt) level corresponding to a target state; programming at least one reference cell of a number of reference cells coupled to the selected word line to a target reference Vt level, the number of reference cells interleaved with the number of data cells; determining a reference state based on a data read of the at least one reference cell; and changing a state read from the at least one data cell based on a change of the at least one reference cell.

30 Claims, 7 Drawing Sheets

NON-VOLATILE MULTILEVEL MEMORY CELLS WITH DATA READ OF REFERENCE CELLS

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on, or removed from, the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

MLC memory stores multiple bits on each cell by using different threshold voltage (Vt) levels for each state that is stored. The difference between adjacent Vt distributions may be very small for a MLC memory device as compared to a SLC memory device. The reduced margins between adjacent Vt distributions, e.g., program states, can increase the difficulty associated with distinguishing between adjacent program states, which can lead to problems such as reduced data retrieval reliability.

For example, various data degradation mechanisms exist which can cause the Vt level of a cell to shift such that the Vt level no longer corresponds to a desired Vt distribution, e.g., program state, for the cell. Data degradation mechanisms can affect the Vt levels of cells at various times such as during programming and/or reading of the data stored by a memory cell. Data degradation mechanisms can include program disturb mechanisms, program verify and/or read disturb mechanisms, and charge loss mechanisms, to name a few.

Some such data degradation mechanisms can have systematic effects on cells of a given row, e.g., word line, of a memory array. The systematic effects can occur on a group basis, e.g., on groups of cells such as pages and/or sectors of cells on a word line that can be programmed and/or read together. That is, some degradation mechanisms can cause a Vt shift of groups of cells on a word line in a systematic manner. For instance, some program and/or read disturb mechanisms can cause the Vt levels of a group of cells on a particular word line to shift by particular voltage amounts, e.g., 20 mV, 50 mV, 100 mV, or 200 mV, on a relatively consistent basis. In some cases, a systematic Vt level shift associated with the group of cells may depend on the desired program state, e.g., the Vt level shift may be different for program states corresponding to higher target Vt levels than for program states corresponding to lower target Vt levels.

Memory cells affected by data degradation mechanisms can become unreliable, e.g., the logical value read from the cells may not necessarily be the logical value written to the cells.

DETAILED DESCRIPTION

Figure 1:
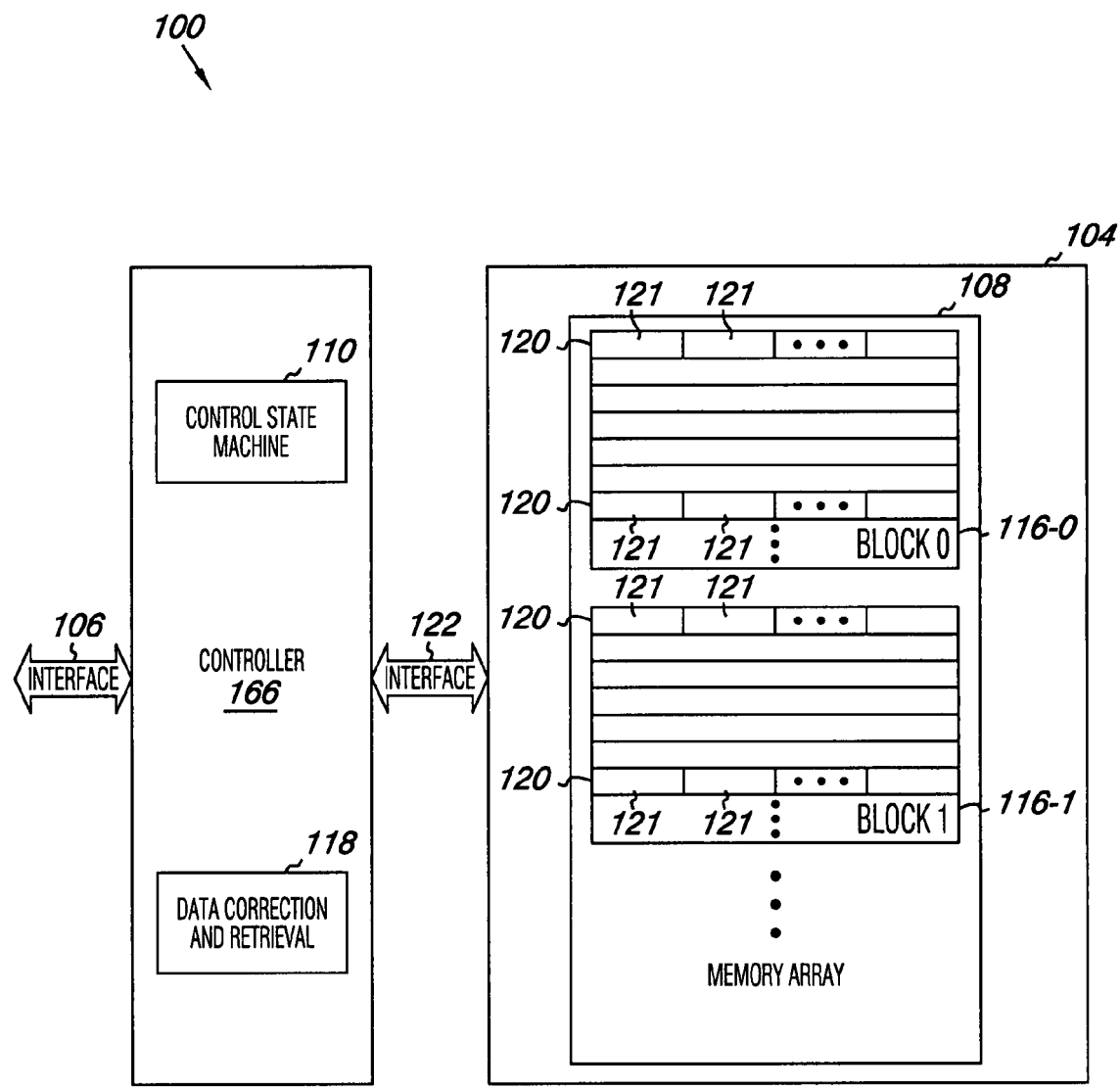
FIG. 1 is a block diagram of an electronic system having a memory device in accordance with an embodiment of the present disclosure.

Embodiments of the present disclosure provide methods, devices, modules, and systems for improving non-volatile multilevel memory cell data retrieval with data read of reference cells. Embodiments use reference cells interleaved with data cells to compensate for various systematic and/or transient data degradation mechanisms. One method embodiment includes programming at least one data cell of a number of data cells coupled to a selected word line to a target data threshold voltage (Vt) level corresponding to a target state; programming at least one reference cell of a number of reference cells coupled to the selected word line to a target reference Vt level, the number of reference cells interleaved with the number of data cells; determining a reference state based on a data read of the at least one reference cell; and changing a state read from the at least one data cell based on a change of the at least one reference cell. In various embodiments, the method includes changing the state read from the at least one data cell to an appropriate state based on a difference between the determined reference state and a target reference state corresponding to the target reference Vt level.

In various embodiments, the target data Vt level and the target reference Vt level are the same. Changing the state read from the at least one data cell can include changing the state of the at least one data cell to the target state if it is determined that the reference state is a state other than the target state. In various embodiments, determining the reference state based on the data read of the reference cells includes determining a Vt shift amount, away from the target Vt level, associated with the reference cells and determining whether the Vt shift amount is more than an acceptable margin from the target Vt level such that the shifted Vt level corresponds to a state other than the target state. In some embodiments, the Vt shift amount is an average Vt shift amount associated with a statistically significant number of a group of reference cells each programmed to the same target Vt level. In some embodiments, determining the Vt shift amount includes using a statistical method to determine an overall shift of the interleaved reference cells.

In various embodiments, the data cells and the interleaved reference cells are programmed simultaneously. The target Vt levels and associated target states of the data cells can be the same target Vt levels and target states of the interleaved reference cells.

In various embodiments, a read of a group of data cells on a selected word line is performed at the same time as corresponding reference cells on the selected word line are read. The read conditions for reading the data cells and the reference cells can be the same in various embodiments. For instance, in some embodiments, the read reference voltages used to perform the data read of the reference cells can be the same as read reference voltages used to read the data cells.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

FIG. 1 is a block diagram of an electronic system 100 having a memory device 104 in accordance with an embodiment of the present disclosure. In the system 100, the memory device 104, e.g., a NAND flash memory device 104, is coupled to a controller 166 via interface 122. The controller 166 can provide access to the memory device 104 from an external host (not shown), e.g., a personal computer, cellular telephone, digital camera, personal digital assistant, or other external host device, via an interface 106. In various embodiments, the controller 166 can be coupled to more than one memory device, e.g., 104.

In the embodiment illustrated in FIG. 1, the controller 166 includes a control state machine 110, e.g., an embedded processor 110, which can direct internal operation of the memory device 104. For instance, the control state machine 110 can perform functions including managing one or more memory arrays 108, directing data accesses, updating internal control registers and tables (not shown), and/or directing operation of other possible hardware components (not shown) of the memory device 104 and/or controller 166, among various other functions. As one of ordinary skill in the art will appreciate, the controller 166 can also include associated buffer memory (not shown), e.g., RAM and/or ROM, which can store data being written to and/or read from the memory array 108.

As illustrated in FIG. 1, in various embodiments, the controller 166 includes a data correction and retrieval component 118. The data correction and retrieval component 118 can be circuitry that is integrated with and/or controlled by control state machine 110. As described in further detail below, the data correction and retrieval component 118 can be used to improve non-volatile multilevel memory cell data retrieval reliability by using reference cells interleaved with data cells to compensate for various systematic and/or transient data degradation mechanisms associated with memory device 104 and/or interface 122.

In the embodiment illustrated in FIG. 1, the controller 166 is external to the memory device 104. However, in various embodiments, the controller 166 can be an internal controller of the memory device 104. In such embodiments, the system 100 can be referred to as a memory subsystem 100. In such embodiments, the memory subsystem 100 can be a flash memory card, as one example.

The memory array 108 contains floating gate memory cells arranged in a sequence of memory blocks 116-0 (BLOCK 0), 116-1 (BLOCK 1). As an example, the number of memory blocks in array 108 may be 128 blocks, 512 blocks, or 1,024 blocks, but embodiments are not limited to a particular number of memory blocks in an array 108. In various embodiments, the blocks 116-0 and 116-1 can be referred to as erase blocks. In such embodiments, the memory cells in each block are erased at the same time. Each memory block, e.g., 116-0 and 1 16-1, contains a number of physical rows 120 of memory cells.

Figure 3:
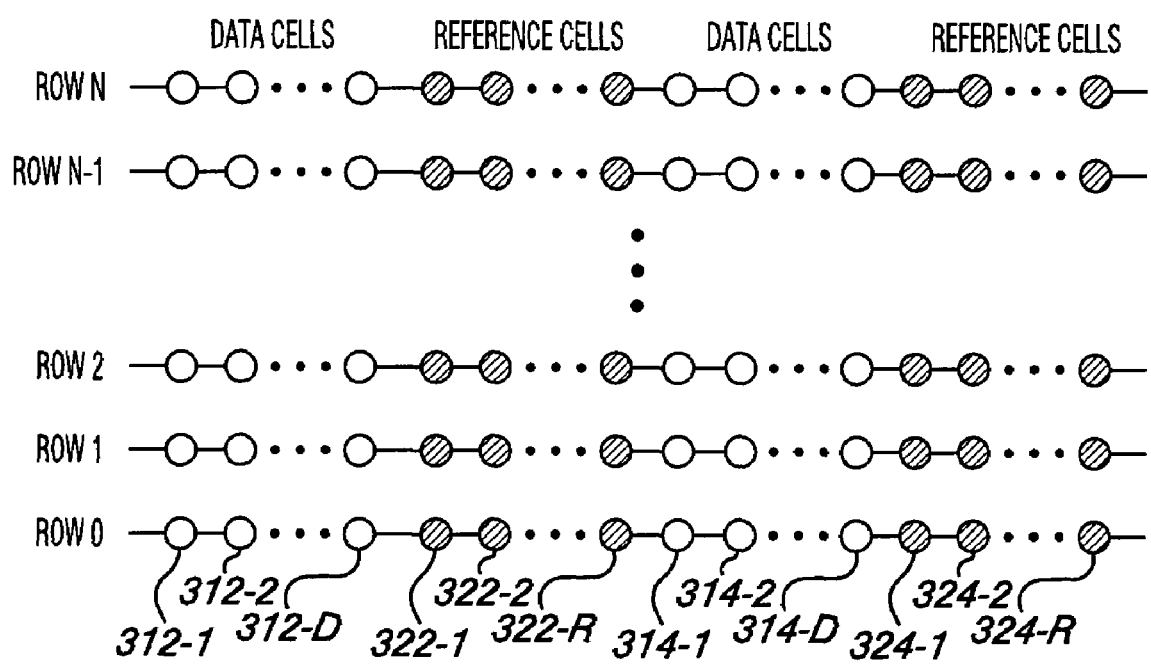
FIG. 3 is a schematic of a portion of an array of non-volatile memory cells having reference cells interleaved with data cells in accordance with an embodiment of the present disclosure.

In various embodiments, and as described further in connection with FIG. 3, each physical row 120 of memory cells includes reference memory cells interleaved with the data memory cells. The reference cells are physically the same as the data cells, e.g., they both are floating gate memory cells. In various embodiment, the target Vt levels to which the memory cells are programmed are the same for both the data cells and interleaved reference cells. Also, in various embodiments, the same read conditions can be used to read the states of the data cells and the reference cells. For example, in some embodiments, the read reference voltages used to read the states of the memory cells are the same for both the data cells and the reference cells.

In various embodiments, the reference cells coupled to each physical row 120 can be organized as a number of reference cell batches. The number of batches of reference cells can be the same as the number of program states associated with the data cells. For example, the number of batches can be sixteen for a four-bit data cell, e.g., a cell having sixteen target states. In this example, each of the sixteen batches of the reference cells can be associated with a different target Vt level, e.g., target state.

The reference cells can be erased and programmed at the same time as the data cells in a particular row such that the reference cells are exposed to the same or similar erase/program cycling and the same program disturb conditions as the data cells. The batches of reference cells can also be read at the same time as an associated group, e.g., a logical sector or a page, of data cells. Embodiments are not so limited, e.g., in some embodiments, the reference cells can be read at a different time than the data cells.

In various embodiments, the controller 166, e.g., control state machine 110 and/or data correction and retrieval component 118, can perform an averaging of a read batch of reference cells programmed to a particular target Vt level in order to determine an average Vt level associated with the read batch of reference cells, e.g., an average Vt shift away from the particular target Vt level. If it is determined that the average Vt level of the read batch of reference cells corresponds to a program state other than the target state to which the batch was programmed, then the data correction and retrieval component 118 can change the logic state of read data cells that were also programmed to the particular target Vt level/target state. That is, data stored in data cells read to store data corresponding to the program state determined based on the averaging performed on the batch of reference cells can be changed back to the target state via the data correction component 118.

For example, assume that a number of data cells in a group, e.g., logical sector 121, and an associated batch of reference cells interleaved with the group are programmed to a particular target Vt level corresponding to a particular target state, e.g., "01," "00," or "10" for a two-bit cell. For this example, assume various data cells in the group and the associated batch of reference cells are programmed to a target Vt level corresponding to the "01" target state. A read operation can then be performed to determine the present Vt levels/states for the cells, which may have changed since the cells were programmed to the particular target state, e.g., due to various data degradation mechanisms such as program disturb, read disturb, charge loss disturb, and/or other systematic and/or transient data degradation mechanisms.

In various embodiments, the data correction and retrieval component 118 can perform an averaging on the batch of read reference cells and can adjust the read Vt levels and/or logic states of the data cells based on the averaging performed on the read batch of reference cells. For instance, the averaging performed on the batch of read reference cells can result in a determination that the batch of reference cells represents the "00" state instead of the "01" target state. In various embodiments, the data correction and retrieval component 118 can correct the data stored in the read data cells that were programmed to the "01" target state, but may now store "00" due to a Vt level shift. That is, the data stored in data cells read as storing "00", e.g., the state of the read batch of reference cells based on the averaging operation, can be changed/corrected to "01", e.g., the target state.

In this manner, data retrieval errors and unreliability caused by various systematic data degradation mechanisms discussed herein can be reduced or prevented. For instance, the data read from the data cells that were programmed to "01" target state in this example would be corrected from "00" to "01" based on the average read state of the batch of reference cells such that the incorrect state, e.g., "00" in this example, is not erroneously reported to an external host that requested the data stored by the group of data cells. Embodiments are not limited to the above example.

The number of cells per physical row 120 corresponds to the number of columns, e.g., bit lines, and can be 4,256, 8,512, or 16,384, among various other numbers of cells, which may depend on factors such as the amount of overhead data associated with the user data. In some embodiments, the cells in each row 120 are associated with an even or an odd bit line. In some embodiments, the number of rows 120 in each memory block can be 32, but embodiments are not limited to a particular number of rows 120 per block.

In various embodiments, the rows 120 contain one or more logical sectors 121. Each logical sector 121 can store a number of bytes of data, e.g., 256 bytes, 512 bytes, or 1,024 bytes, but embodiments are not limited to a particular number of bytes of data stored in a logical sector 121. In operation, the memory cells in each logical sector 121 can be selected to be simultaneously written to and/or read from as a group. As one of ordinary skill in the art will appreciate, the memory cells in each logical sector 121 can have a number of associated logical pages. The logical pages can correspond to the number of binary bits stored in each cell and can be separately addressed, which can allow for the logical pages of the cells to be programmed and/or read at different times. As an example, in an array of two-bit cells, e.g., cells storing one of four binary states, the cells in each logical sector 121 may have two logical pages, e.g., an upper page and a lower page, while an array of four-bit cells may have four logical pages, e.g., an upper page and three lower pages, associated with each logical sector 121. In multilevel cells, each of the bits stored in a single memory cell can be from a different logical page.

It is noted that other formats and/or configurations for the blocks 116-0, 116-1, rows 120, sectors 121, and pages are possible. For example, the rows 120 of the memory blocks 116-0, 116-1 can include a single sector 121 which can include more or less than 512 bytes of data.

Figure 2:
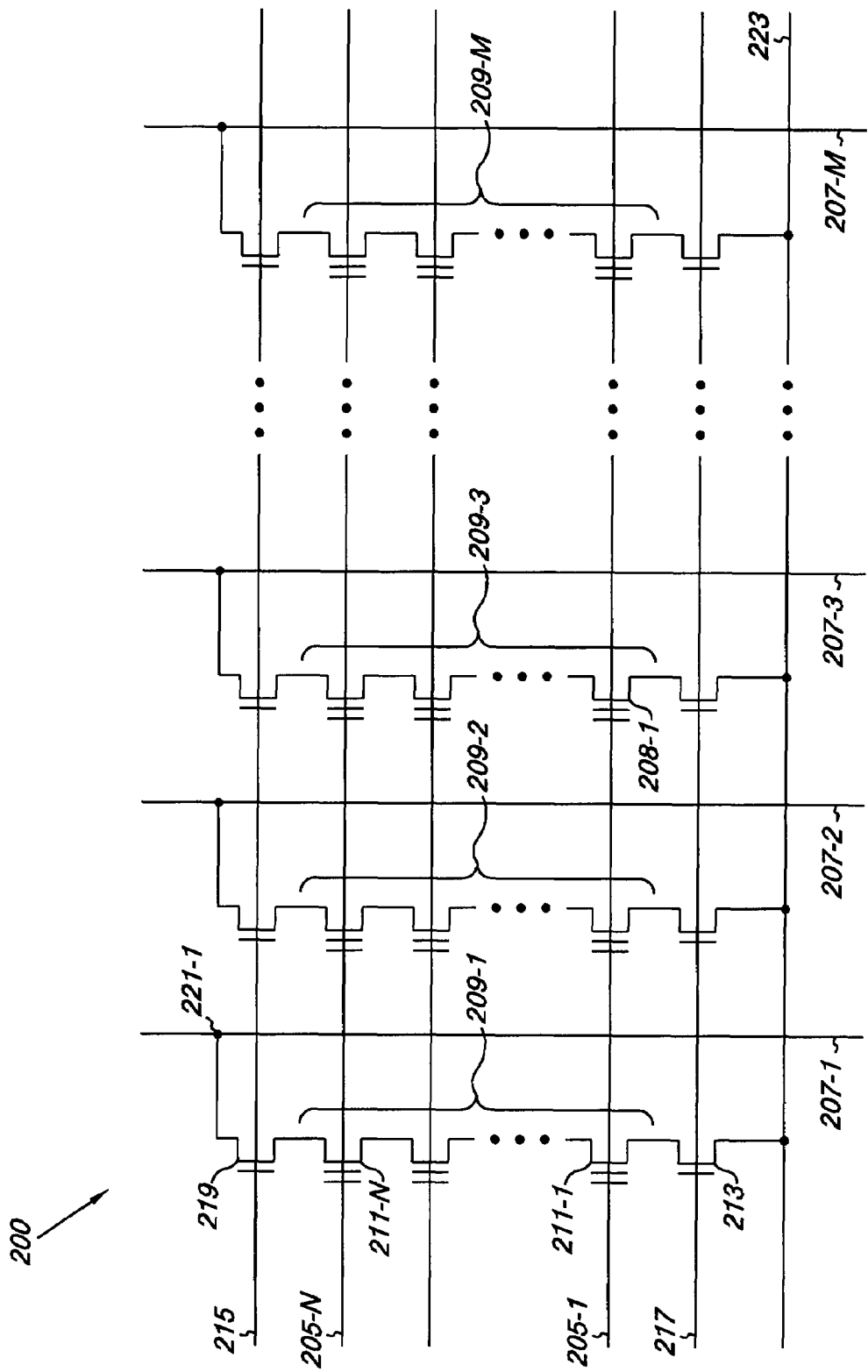
FIG. 2 is a schematic of a portion of a non-volatile memory array that can be used with embodiments of the present disclosure.

FIG. 2 is a schematic of a portion of a non-volatile memory array 200 that can be used with embodiments of the present disclosure. The embodiment of FIG. 2 illustrates a NAND architecture non-volatile memory. However, embodiments described herein are not limited to this example. As shown in FIG. 2, the memory array 200 includes word lines 205-1, . . . , 205-N and intersecting bit lines 207-1, . . . , 207-M. For ease of addressing in the digital environment, the number of word lines 205-1, . . . , 205-N and the number of bit lines 207-1, . . . , 207-M are each some power of two, e.g., 256 word lines by 4,096 bit lines, etc.

Memory array 200 includes NAND strings 209-1, . . . , 209-M. Each NAND string includes non-volatile memory cells 211-1, . . . , 211-N, each located at an intersection of a word line 205-1, . . . , 205-N and a local bit line 207-1, . . . , 207-M. The non-volatile memory cells 211-1, . . . , 211-N of each NAND string 209-1, . . . , 209-M are connected in series source to drain between a source select gate (SGS), e.g., a field-effect transistor (FET) 213, and a drain select gate (SGD), e.g., FET 219. Source select gate 213 is located at the intersection of a local bit line 207-1 and a source select line 217 while drain select gate 219 is located at the intersection of a local bit line 207-1 and a drain select line 215.

As shown in the embodiment illustrated in FIG. 2, a source of source select gate 213 is connected to a common source line 223. The drain of source select gate 213 is connected to the source of the memory cell 211-1 of the corresponding NAND string 209-1. The drain of drain select gate 219 is connected to the local bit line 207-1 for the corresponding NAND string 209-1 at drain contact 221-1. The source of drain select gate 219 is connected to the drain of the last memory cell 211-N, e.g., floating-gate transistor, of the corresponding NAND string 209-1.

In various embodiments, construction of non-volatile memory cells, 211-1, . . . , 211-N, includes a source, a drain, a floating gate or charge storage layer, and a control gate. Non-volatile memory cells, 211-1, . . . , 211-N, have their control gates coupled to a word line, 205-1, . . . , 205-N respectively. A column of the non-volatile memory cells, 211-1, . . . , 211-N, make up the NAND strings, e.g., 209-1, . . . , 209-M, coupled to a given local bit line, e.g., 207-1, . . . , 207-M respectively. A row of the non-volatile memory cells are commonly coupled to a given word line, e.g., 205-1, . . . , 205-N. An AND array architecture would be similarly laid out except that the string of memory cells would be coupled in parallel between the select gates.

In various embodiments, and as described further in connection with FIG. 3, each row 205-1 to 205-N of non-volatile memory cells includes a number of reference cells interleaved with the data cells of a given row 205-1 to 205-N. The reference cells can be interleaved with the data cells of a given row 205-1 to 205-N in a variety of ways.

As previously mentioned, in various embodiments, the reference cells have the same target Vt levels corresponding to program states as the data cells, e.g., the target Vt level for a particular program state, e.g., "1101," is the same for a data cell and a reference cell. Similarly, the read reference voltages used to read data stored by a data cell are the same read reference voltages used to read data stored by a reference cell. For instance, if a data cell and reference cell are both programmed to a particular target state, e.g., "1101," and a read reference voltage associated with the "1101" state is 1.6V, then a read reference voltage of 1.6V is used to read both the data cell and the reference cell that was programmed to the "1101" target state. Simultaneously programming both data cells and interleaved reference cells to the same target Vt levels and performing read operations using the same reference read voltages for both data cells and interleaved reference cells can allow the read state of the reference cells to be used to correct for systematic errors for respective data cells caused by various systematic data degradation mechanisms.

FIG. 3 is a schematic of a portion of an array, e.g., memory array 108 shown in FIG. 1 or array 200 shown in FIG. 2, of non-volatile multilevel memory cells having reference cells interleaved with data cells in accordance with an embodiment of the present disclosure. In the embodiment illustrated in FIG. 3, the array includes a number of rows of memory cells, e.g., ROW-0, ROW-1, . . . , ROW-N. The index "N" is used to indicate that the array can include a number of rows, e.g., 16, 32, 64, etc. The cells on each row are coupled to a word line, e.g., word lines 205-1 to 205-N shown in FIG. 2. ROW-0 to ROW-N can correspond to the rows in a block of the array, e.g., block 116-0 and 116-1 shown in FIG. 1. Each of the memory cells is coupled to a bit line, e.g., bit lines 207-1 to 207-M shown in FIG. 2, which may be either an even or odd bit line in some embodiments.

In some embodiments in which even and odd bit lines are used, all the memory cells of a row that are coupled to an even bit line can be written to and/or read from at the same time while all the memory cells of the row coupled to an odd bit line can be written to and/or read from at the same time. In such embodiments, the cells of each row form at least two logical pages, e.g., an even page and an odd page.

As shown in the embodiment illustrated in FIG. 3, each row of memory cells includes both data cells, e.g., 312-1, 312-2, . . . , 312-D and 314-1, 314-2, . . . , 314-D, and reference cells, e.g., 322-1, 322-2, . . . , 322-R and 324-1, 324-2, . . . , 324-R, interleaved therewith. The reference cells can be interleaved with the data cells in a variety of manners.

In the embodiment illustrated in FIG. 3, the data cells 312-1 to 312-D represent a first group of data cells having an associated number of reference cells 322-1 to 322-R interleaved therewith. The data cells 314-1 to 314-D represent a second group of data cells having an associated number of reference cells 324-1 to 324-R interleaved therewith. Although the embodiment illustrated in FIG. 3 includes two groups of data cells 312-1 to 312-D and 314-1 to 314-D and two groups of reference cells 322-1 to 322-R and 324-1 to 324-R, embodiments are not limited to a particular number of groups of data cells and/or reference cells. In some embodiments, the first group of data cells 312-1 to 312-D and associated reference cells 322-1 to 322-R can be associated with an even bit line while the second group of data cells 314-1 to 314-D and associated reference cells 324-1 to 324-R can be associated with an odd bit line. However, embodiments are not limited to this example.

In various embodiments, the first group of data cells 312-1 to 312-D can represent a first logical sector, e.g., sector 121 shown in FIG. 1, and the second group of data cells 314-1 to 314-D can represent a second logical sector. In such embodiments and as mentioned above, the memory cells in each logical sector can be simultaneously written to and/or read from as a group. Also, the memory cells in each logical sector can have a number of associated logical pages that can be separately addressed, e.g., each of the multiple bits stored in a multilevel cell can be from a different logical page. As such, the individual bits stored in a memory cell can be programmed and/or read at different times.

The indices "D" and "R" are used to indicate that the groups of data cells can include a number of data cells and reference cells, respectively. The number of reference cells in each group, e.g., 322-1 to 322-R and 324-1 to 324-R, can depend of a variety of factors such as the type of multilevel cells, e.g., 2-bit or 4-bit MLCs, the number of data cells per group, e.g., 312-1 to 312-D and 314-1 to 314-N, and/or the number of data cells per row, e.g., ROW-0 to ROW-N. As an example, for 4-bit MLCs, e.g., the data cells and reference cells store four data bits, each row can include about 8,000 to 16,000 data cells and about 128 to 1,024 interleaved reference cells.

In various embodiments, the reference cells associated with a group of data cells are interleaved with the respective data cells. For example, the reference cells 322-1 to 322-R can be physically located among, e.g., between, a number of the associated data cells 312-1 to 312-D rather than physically located apart from the associated data cells 312-1 to 312-D as shown in FIG. 3. Physically localizing the reference cells, e.g., 322-1 to 322-R, with an associated group of data cells, e.g., 312-1 to 312-D, can provide benefits such as an increased likelihood that both the data cells and the associated reference cells will observe the same or similar data degradation mechanisms including Vt disturbs due to word line and/or bit line transients and temperature effects, to name a few.

In various embodiments, each group of reference cells, e.g., 322-1 to 322-R, associated with a group of data cells, e.g., 312-1 to 312-D, can include a number of batches of reference cells. In such embodiments, the number of batches can correspond with the number program Vt levels/states associated with the cells. That is, the number of batches can be four, e.g., for two-bit multilevel cells, can be eight, e.g., for three-bit multilevel cells, and can be sixteen, e.g., for four-bit multilevel cells. In such embodiments, each batch of reference cells can be programmed to a different particular target level/state among the number of program states, e.g., 4, 8, 16, etc. Also, each batch of reference cells can be programmed to its particular target level/state while the data cells, e.g., 312-1 to 312-D, in the associated group of data cells are being programmed to that particular target level/state such that the data cells and associated batch of reference cells being programmed to that particular target level/state experience the same or similar program disturb conditions or other data degradation mechanisms.

As an example, assume a number of data cells in the first group of data cells 312-1 to 312-D are to be programmed to a number of different data states, e.g., "1101" is to be written to some of the data cells 312-1 to 312-D, "0101" is to be written to some other of the data cells 312-1 to 312-D, etc. For four-bit MLCs, it is possible that each of the sixteen data states will be written to at least some of the data cells 312-1 to 312-D in the group. In this example, the reference cells 322-1 to 322-R of the associated batch of reference cells corresponding to the "1101" logic state are written/programmed while the data cells 312-1 to 312-D that are to have data "1101" written thereto are written/programmed.

As previously mentioned, each of the four bits in four-bit MLCs can correspond to different logical pages, e.g., an upper page and three lower pages, which can each be programmed at different times. As one example, the first lower page of cells on a particular row, e.g., ROW-0, may be programmed, followed by the first lower page of cells on a different row, e.g., ROW-1. Subsequently to the programming of the first lower page cells on ROW-1, one or more of the second and third lower page and the upper page of cells on ROW-0 may be programmed. One of ordinary skill in the art will appreciate that a number of different page programming algorithms exist. Embodiments of the present disclosure are not limited to a particular programming algorithm. In embodiments in which the data bits stored on the memory cells are from different logical pages, which are programmed at different times, the pages of the interleaved reference cells, e.g., 322-1 to 322-R, associated with a group of data cells, e.g., 312-1 to 312-D, are programmed at the same time that the pages of the data cells in the group of data cells are programmed.

Each batch of reference cells can include a number of reference cells, e.g., 4 reference cells, 8 reference cells, or 20 reference cells, among various other numbers of reference cells. In various embodiments of the present disclosure, an averaging can be performed on the reference cells in each batch for purposes of data correction and/or data retrieval reliability as described herein. As such, the number of reference cells in each batch can depend on the particular averaging algorithm executed by the data correction and retrieval component, e.g., component 118 of controller 166 shown in FIG. 1.

For example, as mentioned above and described further below in connection with FIGS. 5-7, a read of the reference cells in each batch, e.g., each of the reference cells being programmed to a different particular Vt level/state, can be performed and a reference state can be determined based thereon. In some embodiments, the reference state can be based on an average Vt level shift amount, away from the particular target Vt level, for the cells in the batch.

In various embodiments, the Vt level shift amount is caused by a systematic data degradation mechanism that can cause the Vt levels of some or all of the cells, e.g., data cells as well as interleaved reference cells, on a row/word line to shift in a similar manner. In various embodiments, the determined average Vt shift amount and/or the determined reference state associated with the batch can be used to adjust the Vt levels and/or logic states of data cells in the group of cells 312-1 to 312-D or in the entire row, e.g., ROW-0, which were programmed to the particular Vt level/state associated with the batch.

As an example, if the particular Vt state associated with the batch is "1101", e.g., the reference cells of the batch were programmed to the "1101" target state, and the averaging algorithm performed on the read reference cells determines that the Vt level shift amount is such that the reference state of the batch is "1100", e.g., a state other than the "1101" target state, then the logic states of data cells in the associated group of data cells 312-1 to 312-D or in ROW-0 that were programmed to the "1101" target state also experience a Vt level shift amount sufficient such that the data cells will be read as having "1100", e.g., an incorrect data state, stored thereon. As such, embodiments of the present disclosure correct the read state of the data cells 312-1 to 312-D, e.g., change the read state from "1100" to the correct "1101" target state in this example, based on the averaging of the batch of reference cells, e.g., a batch from reference cells 322-1 to 322-R, and determined reference state associated therewith.

Figure 4:
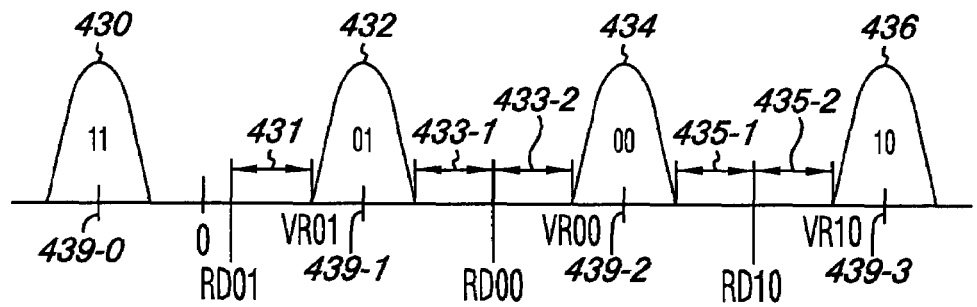
FIG. 4 illustrates a diagram of target Vt distributions in accordance with an embodiment of the present disclosure.

FIG. 4 illustrates a diagram of target threshold voltage (Vt) distributions in accordance with an embodiment of the present disclosure. Although FIG. 4 illustrates four target Vt distributions 430, 432, 434, 436 for a four-state, e.g., two-bit, array of multilevel memory cells (MLCs), embodiments are not limited to two-bit MLCs or to a particular type of Flash architecture, e.g., NAND.

As shown in the diagram illustrated in FIG. 4, each of the target Vt distributions 430, 432, 434, and 436 has a corresponding target Vt level 439-0, 439-1, 439-2, and 439-3. As the reader will appreciate, the target Vt distributions 430, 432, 434, and 436 are a result of the inability of program algorithms to achieve the exact target Vt levels 439-0, 439-1, 439-2, and 439-3. In the diagram of FIG. 4, the four target Vt distributions 430, 432, 434, and 436 represent logic data states "11", "01", "00", and "10", respectively.

In an example programming algorithm, verify voltage levels, e.g., VR01, VR00, and VR10 as shown in FIG. 4, can be used to determine when to cease applying programming voltage pulses to particular memory cells. In this example, cells are to be programmed from the erase state, e.g., "11", to some other state, e.g., one of the program states "01", "00," and "10". For those cells to be programmed into state "01" out of erase state "11", the pulsing is terminated when their Vt level becomes equal to or greater than the program verify level VR01, corresponding to distribution 432. The states of the cells can be verified in between the programming pulses. Similarly, pulsing is terminated for those cells to be programmed into the "00" state when their Vt level becomes equal to or greater than the program verify level VR00, corresponding to distribution 434. Finally, for those cells being programmed into the "10" state, the program pulses are terminated when their Vt level reaches the program verify level VR10, corresponding to distribution 436. At that point, the parallel programming of the group of the memory cells has been completed.

The diagram illustrated in FIG. 4 represents an example of the target Vt distributions 430, 432, 434, and 436, target Vt levels 439-0, 439-1, 439-2, and 439-3, and verify voltage levels VR01, VR00, and VR10 for data cells, e.g., 312-1 to 312-D shown in FIG. 3, and for interleaved reference cells, e.g., 322-1 to 322-R shown in FIG. 3. That is, as noted above, target Vt levels, e.g., 439-0, 439-1, 439-2, and 439-3, and verify levels, e.g., VR01, VR00, and VR10, are the same for the data cells and reference cells. For instance, if the target Vt level 439-1 is 0.7V and the corresponding verify level VR01 is 0.5V for data cells, then those same values are used to program the reference cells.

FIG. 4 also illustrates the read reference voltages used to determine into which of the four target states the memory cells, e.g., data cells and reference cells have been programmed. The read reference voltage levels RD01, RD00, and RD10 are reference voltages used to read the "01", "00" and "10" storage states, respectively. The read reference voltages are the voltages with which the Vt of each memory cell being read is compared. In various embodiments, the read reference voltages can be positioned roughly halfway between adjacent ones of the voltage distributions 430, 432, 434 and 436. As an example, RD01 may be about 0.1V, RD00 may be about 1.0V, and RD10 may be about 1.9V.

The difference between a program verify level and a corresponding read reference level can be referred to herein as a read margin. The distribution illustrated in FIG. 4 includes read margins 431, 433-1, 433-2, 435-1, and 435-2. A memory cell intended to be programmed into the "00" state may transition, e.g., shift due to disturb mechanisms, to an erroneous data state if the Vt level moves below the reference read level RD00 such that the Vt level is not within read margin 433-2. In this example, the memory cell would be read as being in an incorrect state, e.g., the "01" state. Similarly, the "00" cell would be read as having an incorrect data state, e.g., the "10" state, if the threshold level were to transition, e.g., shift, above the reference read level RD10.

As the reader will appreciate, narrower read margins can increase the likelihood of erroneous bits as relatively small Vt level shifts can cause the Vt level to shift across a reference read level from a correct to an incorrect state. Such Vt level shifts can result from various data degradation mechanisms. Some such data degradation mechanisms can be systematic, e.g., they can affect the Vt levels of programmed cells on a consistent basis and/or in a consistent manner.

As described herein, various embodiments of the present disclosure can provide for an increase in data retrieval reliability by including reference cells interleaved with data cells for each row in an array of non-volatile multilevel memory cells. In some embodiments, a number of data cells, e.g., 312-1 to 312-D shown in FIG. 3, and interleaved reference cells, e.g., 322-1 to 322-R shown in FIG. 3, coupled to a selected word line, e.g., row, are simultaneously programmed to the same target Vt level corresponding to a particular target state. In such embodiments, a reference state can be determined based on a data read of the reference cells, e.g., 322-1 to 322-R. In various embodiments the reference state is based on an averaging algorithm executed by a data correction component, e.g., correction component 118 of controller 166 shown in FIG. 1. In such embodiments, the data read operation performed on the programmed data cells, e.g., 312-1 to 312-D, can be simultaneously performed on the programmed reference cells, e.g., 322-1 to 322-R, and the data correction component can change the state read from the data cells to the correct state, e.g., the target state to which the data cells and reference cells were programmed, if it is determined that the reference state is a state other than the target state.

Figure 5:
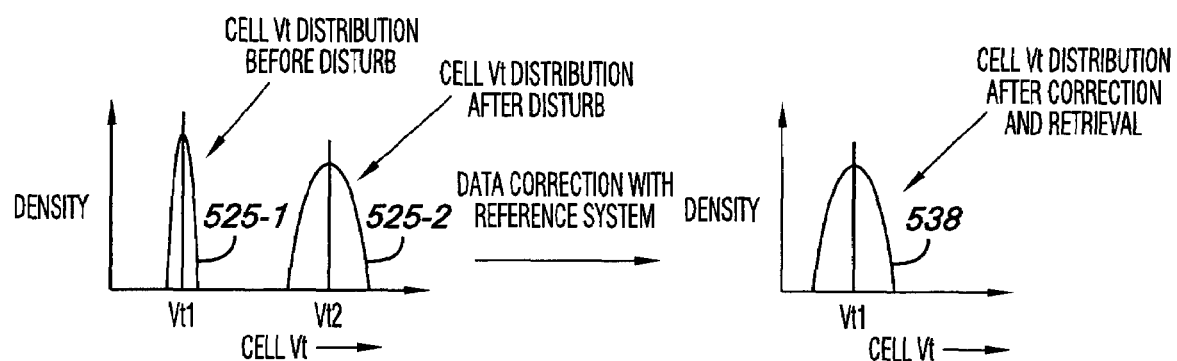
FIG. 5 illustrates a diagram of a target Vt distribution before and after a disturb mechanism as well as the Vt distribution after a data correction operation in accordance with an embodiment of the present disclosure.

FIG. 5 illustrates a diagram of a target Vt distribution before and after a disturb mechanism as well as the Vt distribution after a data correction operation in accordance with an embodiment of the present disclosure. In the diagram illustrated in FIG. 5, the Vt distribution 525-1 represents a distribution of Vt levels of data cells, e.g., data cells 312-1 to 312-D described in FIG. 3, of a selected row, e.g., ROW-0 to ROW-N described in FIG. 3, which have been programmed to target Vt level Vt1, which corresponds to a particular target state, e.g., "10", "00", "01", etc. In the diagram of FIG. 5, the Vt distribution 525-2 represents the distribution 525-1 subsequent to the data cells experiencing one or more data degradation mechanisms, e.g., program disturb, read disturb, charge loss, etc. As shown in FIG. 5, the one or more data degradation mechanism resulted in a shift, e.g., an increase in this example, and a widening of Vt distribution 525-1 such that Vt distribution 525-2 is centered on an increased Vt level, e.g., Vt2 as shown.

Performing a data read operation on the disturbed data cells, e.g., data cells of distribution 525-2, can result in data retrieval unreliability and/or data errors. As described in FIG. 4, the Vt level of a cell can be near or outside of a read margin, e.g., read margin 433-2, associated with a particular target state, e.g., distribution 434 representing state "00" as shown in FIG. 4. In the example of FIG. 5, the shifted level Vt2 can be near or outside of a read margin associated with the target state corresponding to the target level Vt1. As such, a data read of the disturbed data cells can result in an incorrect result, e.g., one or more bits stored by the data cell can be a logic "0" instead of a logic "1" or vice versa.

As described in connection with FIG. 3, the data cells, e.g., 312-1 to 312-D, of a given row of memory cells, have a number of associated reference cells, e.g., 322-1 to 322-R, interleaved therewith. As described herein, the interleaved reference cells associated with a group of data cells can include a number of reference cell batches, e.g., a batch of reference cells for each target Vt level/state, each batch being programmed to a particular target Vt level while data cells in the associated group of data cells, e.g., 312-1 to 312-D, are programmed to the particular target Vt level/state.

As such, in the embodiment illustrated in FIG. 5, a batch of reference cells interleaved with the data cells programmed to target level Vt1 was programmed to target level Vt1 while the data cells of distribution 525-1 were programmed to Vt1. Also, since the reference cells are interleaved with the data cells on the same row and are localized with the respective data cells, the reference cells programmed to Vt1 also experience the same and/or similar program disturb mechanisms, charge loss mechanisms, temperature effects, and/or other data degradation mechanisms as the data cells programmed to Vt1. As such, the cells in the batch of reference cells programmed to Vt1 can experience the same or similar Vt level shift amounts as the data cells, e.g., the Vt levels of the reference cells in the batch can shift from Vt1 to Vt2 due to the degradation effects.

In various embodiments described herein, a data correction and retrieval component, e.g., component 118 of controller 166 shown in FIG. 1, can perform an averaging algorithm on the batch of reference cells programmed to target Vt level Vt1 and can correct the Vt levels of the data cells that were programmed to Vt1 based on the averaging of the reference cells in the batch. That is, as shown in FIG. 5, the correction component, e.g., 118 shown in FIG. 1, can correct the Vt levels of the data cells based on the averaging of the reference cells such that the disturbed Vt levels, e.g., distribution 525-2, of the data cells are shifted back to Vt1 as shown by distribution 538.

In some embodiments, the averaging algorithm can include determining those batches of reference cells that represent a logic state other than the particular target state by determining a most common logic state represented by the read reference cells in each batch. For example, if the batch of reference cells consists of 10 reference cells and if a data read of a logical page results in 7 of the cells having a logic "1" value and the other 3 cells having a logic "0" value, then the average value, e.g., most common logic state, associated with that particular logical page would be "1".

As described above, a batch of reference cells can include several reference cells, e.g., 4, 10, 20, 64, 128, or 200. In some embodiments, each batch includes at least four reference cells, but embodiments are not limited to a particular number of reference cells per batch. In various embodiments, a data read operation is performed to determine the Vt levels of the reference cells in the batch. An averaging of the Vt levels of the reference cells can be performed and the determined average Vt level can be compared to the target Vt level to which the batch of reference cells was programmed, e.g., the determined average Vt level of the batch would be compared to Vt1 in this example, to determine an average Vt shift amount away from the target Vt level, e.g., away from Vt1 in the example of FIG. 5. In such embodiments, the data correction component can adjust the Vt levels of data cells which were programmed to the target Vt level, e.g., Vt1, based on the determined shift amount. For example, in the embodiment illustrated in FIG. 5, the determined average shift amount was used to shift the Vt levels of the data cells from distribution 525-2 to distribution 538. Adjusting the Vt levels of the data cells, e.g., correcting for the Vt shift due to various disturb mechanisms, can increase data retrieval reliability.

In some embodiments, the determined average Vt level of the read batch of reference cells can correspond to a reference state, which may or may not be the target state to which the reference cells of the batch were programmed. That is, the determined average Vt level of the read batch can correspond to a logic state other than the target logic state. For instance, if the target state is "1101" and the average Vt level of the read reference cells is within a read margin associated with "1101," then the reference state would be "1101." In various embodiments, if the determined reference state of the batch of reference cells is a state other than the target state, e.g., "1100" in this example, then the data correction component can change/correct the data stored in data cells based on the reference state.

For instance, if the data correction component determines, based on a data read operation, that the average Vt level of the batch of reference cells corresponds to the "1100" data state, then the data stored in the data cells that were programmed to the "1101" state while the batch of reference cells were programmed to the "1101" state will be changed/corrected from the "1100" state to the correct state, e.g., the "1101" target program state. Because the batch of reference cells interleaved with the data cells experience the same systematic data degradation mechanisms as the data cells, a data read of the data cells and batch of reference cells programmed to the target "1101" data state will result in data "1100." Therefore, the data state of the data cells read to store data "1100," e.g., the incorrect data state, can be changed/corrected from "1100" to "1101," e.g., the correct data state, based on the averaging performed on the read reference cells.

Embodiments are not limited to the example described above. For example, in various embodiments, the reference cells can be programmed to a target reference Vt level, e.g, a target reference state, which is different from the target data Vt level, e.g., different than the target state to which the data cells are programmed. In such embodiments, a state read from a data cell can be changed to an appropriate state based on a difference between the determined reference state and the target reference state corresponding to the target reference Vt level. For instance, if it is determined that a Vt shift amount associated with a read batch of reference cells is more than a threshold margin, e.g., 20 mV or 50 mV, then the state read from the data cell can be changed to a correct state, e.g., to the target data state to which the data cell was programmed.

A read operation can be simultaneously performed on a group of data cells, e.g., a sector of cells 121 as shown in FIG. 1, and on the batches of reference cells associated therewith, e.g., on a number of batches of reference cells each of which corresponds to a different particular target Vt level/state. Simultaneously reading the group of data cells and associated reference cells interleaved therewith, can ensure that the data cells and reference cells experience the same or similar data disturb conditions.

Figure 6:
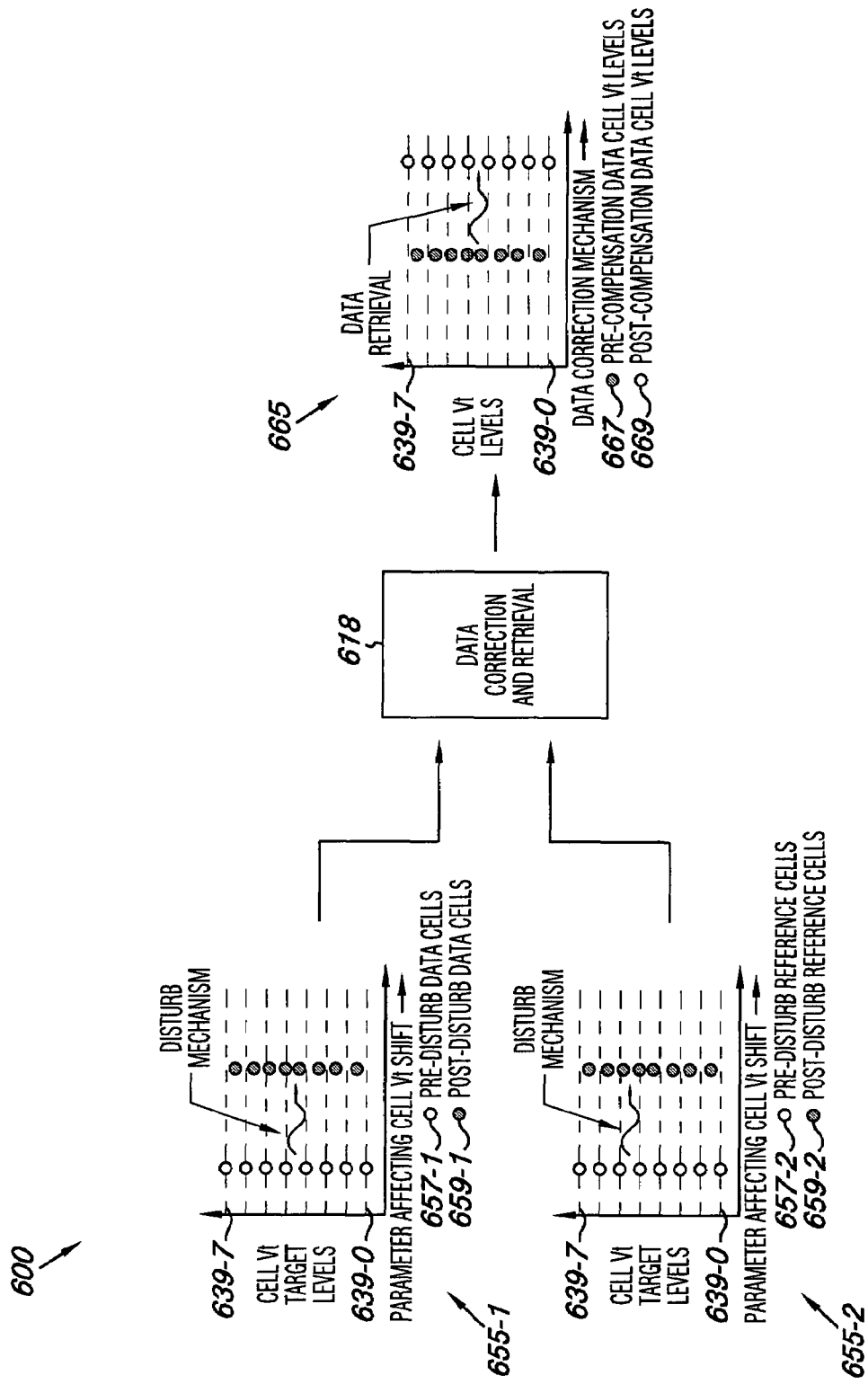
FIG. 6 illustrates a diagram of Vt distributions for data cells and interleaved reference cells after being disturbed as compared to the target Vt levels as well as the Vt distributions of the data cells after being adjusted according to an embodiment of the present disclosure.

FIG. 6 illustrates a diagram 600 of Vt distributions for data cells and interleaved reference cells after being disturbed as compared to the target Vt levels. FIG. 6 also shows the Vt distributions of the data cells after being adjusted according to an embodiment of the present disclosure. The graphs 655-1, 655-2, and 665 illustrated in diagram 600 of FIG. 6 depict target Vt levels 639-0 to 639-7 corresponding to target program states. Although eight target Vt levels/states are shown in FIG. 6, e.g., for 3-bit MLCs, embodiments are not limited to a particular number of target Vt levels/states.

As shown in FIG. 6, graph 655-1 illustrates the Vt distributions of pre-disturbed data cells 657-1 and the Vt distributions of post-disturb data cells 659-1 in relation to the target Vt levels 639-0 to 639-7, e.g., target program states. The pre-disturb distributions 657-1 represent the Vt levels of data cells subsequent to being programmed to a particular target Vt level 639-0 to 639-7 and prior to experiencing Vt level shifting caused by one or more disturb mechanisms, e.g., program disturb, read disturb, and/or charge loss, among various other systematic and/or transient disturb mechanisms that can alter the Vt levels of programmed non-volatile multilevel memory cells. The post-disturb distributions 659-1 represent the Vt levels of data cells whose Vt levels have shifted due to the one or more disturb mechanisms.

Graph 655-2 illustrates the Vt distributions of pre-disturbed reference cells 657-2 and the Vt distributions of post-disturb reference cells 659-2 in relation to the target Vt levels 639-0 to 639-7. The pre-disturb distributions 657-2 represent the Vt levels of data cells subsequent to being programmed to a particular target Vt level 639-0 to 639-7 and prior to experiencing Vt level shifting caused by the one or more disturb mechanisms. The post-disturb distributions 659-2 represent the Vt levels of data cells whose Vt levels have shifted due to the one or more disturb mechanisms.

In FIG. 6, the target Vt levels 639-0 to 639-7 illustrated in graphs 655-1, 655-2, and 665 are the same voltage levels. The reference cells represented in graph 655-2 can be interleaved with the data cells represented in graph 655-1 and 665, e.g., as illustrated and described in connection with FIG. 3. As shown in FIG. 6, the post-disturb Vt distributions 659-1 and 659-2 are shifted the same amounts, which can be the result of the interleaved reference cells experiencing the same or similar disturb conditions as the data cells.

As described herein above, the interleaved reference cells can include a number of batches of reference cells and each batch can correspond to a different particular target Vt level, e.g., 639-0 to 639-7. The cells in each batch are programmed to the particular target Vt level at the same time, and in the same manner, as one or more data cells are programmed to that particular Vt level. For instance, if the memory cells are 3-bit MLCs having three logical pages associated therewith, then the logical pages for the reference cells and data cells of a selected row are programmed at the same time. That is, an upper page of a reference cell being programmed to "101" is not programmed at a different time than the upper pages of reference cells in a batch of reference cells being programmed to "101."

Graph 665 illustrates the Vt distributions of pre-compensation data cells 667 and the Vt distributions of post-compensation data cells 669 in relation to the target Vt levels 639-0 to 639-7. The pre-compensation distributions 667 represent the Vt levels of data cells subsequent to experiencing the one or more disturb mechanisms and prior to being adjusted/changed via a data correction and retrieval method executed by data correction component 618, e.g., component 118 of FIG. 1.

As described above, the data correction component 618 can perform an averaging on the post-disturb reference cells 659-2. As an example, an average Vt level associated with a batch of disturbed reference cells 659-2 can be determined. The determined average Vt level can be compared to the known particular target Vt level, e.g., 639-0 to 639-7, to which the batch was programmed. The comparison can result in a determined Vt level shift amount, which can be used to adjust the Vt levels of data cells 657-1 that were programmed to the same particular target Vt level.

For instance if an averaging performed on post-disturb data cells 659-2 programmed to the "101" state results in an average Vt level increase of 100 mV from the target Vt level corresponding to the "101" state, then the data correction component 618 can adjust, e.g., decrease by 100 mV in this example, the Vt levels of data cells that were programmed to the "101" state, e.g., the data cells that experienced the same disturb conditions as the interleaved data cells programmed to the "101" state. As shown in graph 665, the data correction component 618 has adjusted the Vt levels of data cells programmed to target Vt level 639-0, e.g., data cells in pre-compensation distribution 667, by decreasing the Vt levels of the data cells such that the post-compensation distribution 669 corresponding to target Vt level 639-0 is closer to the target level 639-0.

Figure 7:
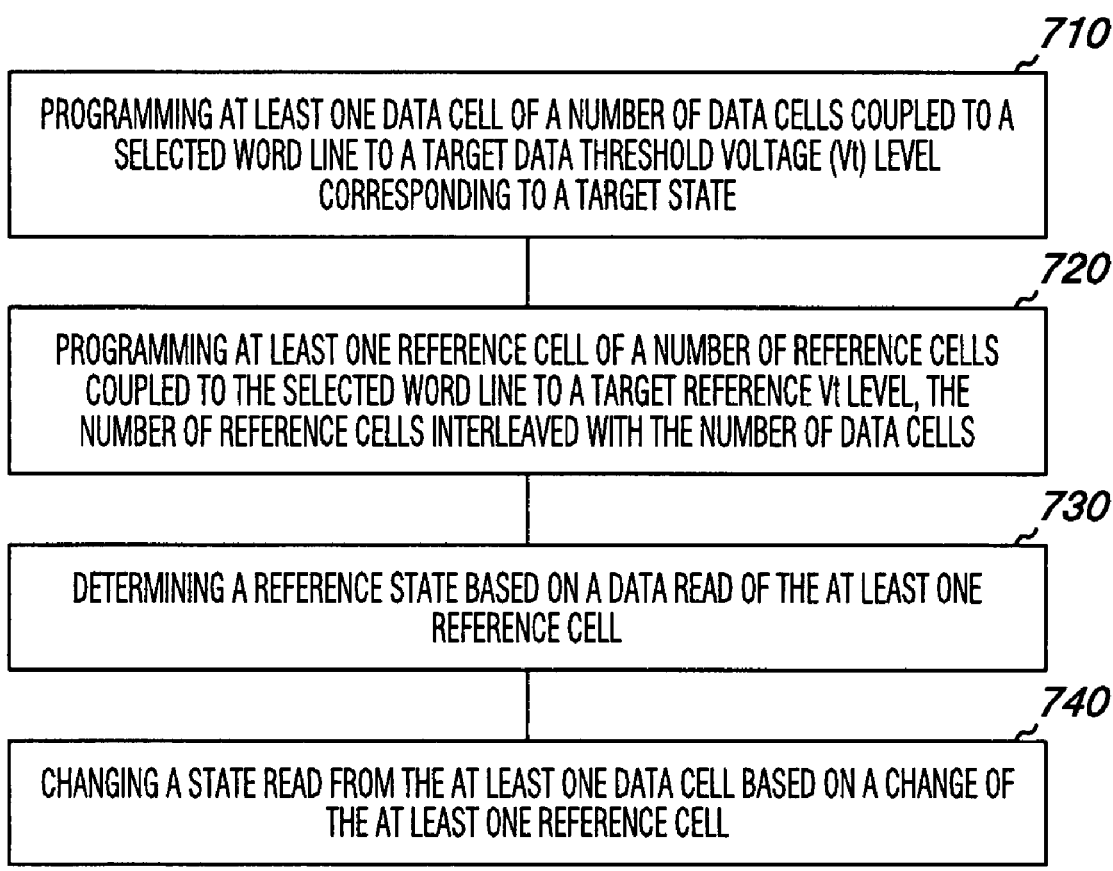
FIG. 7 illustrates an embodiment of a method for non-volatile multilevel memory cells with data read of reference cells.

FIG. 7 illustrates an embodiment of a method 700 for non-volatile multilevel memory cell data retrieval reliability by using reference cells interleaved with data cells to compensate for various systematic and/or transient data degradation mechanisms. At block 710, method 700 includes programming at least one data cell of a number of data cells coupled to a selected word line to a target data threshold voltage (Vt) level corresponding to a target state. At block 720, method 700 includes programming at least one reference cell of a number of reference cells coupled to the selected word line to a target reference Vt level. In various embodiments, the number of reference cells are interleaved with the number of data cells. In various embodiments, the data cells and the interleaved reference cells of a given row/word line are programmed simultaneously.

In various embodiments, the data cells and interleaved reference cells can be programmed to the same target Vt level, e.g., the target data Vt level can be the same as the target reference Vt level. However, embodiments are not so limited. For instance, in some embodiments, the target data Vt level can be different than the target reference Vt level. In such embodiments, a state read from the data cells can be changed to an appropriate state based on a difference between a determined reference state and a target reference state corresponding to the target reference Vt level.

In various embodiments, the interleaved reference cells can include a number of batches and each batch can be associated with a different particular target Vt level/target state. In certain embodiments, for example, each batch of reference cells associated with a target state includes at least four reference cells. In such embodiments, including at least four reference cells in each batch of reference cells can provide a suitable accuracy associated with a determined average Vt shift amount of the batch. In various embodiments, read conditions for reading the data cells are the same for a group of data cells and for a corresponding batch of interleaved reference cells. In some embodiments, the read reference voltages corresponding to the target states are the same for the data cells and interleaved reference cells.

At block 730, method 700 includes determining a reference state based on a data read of the at least one reference cell. In various embodiments, determining the reference state based on the data read of the reference cells includes determining a Vt shift amount, away from the target Vt level, associated with the reference cells and determining whether the Vt shift amount is sufficient such that the shifted Vt level corresponds to a state other than the target state. In some embodiments, the Vt shift amount is an average Vt shift amount of a group, e.g., batch, of reference cells each programmed to the same target Vt level. The Vt shift amount can occur subsequent to the data cells and reference cells being programmed and can be caused by one or more data degradation mechanisms such as program disturbs, read disturbs, charge loss, etc. In various embodiments, the averaging may be performed on only a fraction, e.g., a statistically significant number, of the number of reference cells in a batch. For instance, reference cells of a batch determined to have an associated Vt shift different from the other reference cells of the batch by more than a threshold amount, e.g., 25 mV or 50 mV, may not be considered in determining an average Vt shift amount for the batch. In some embodiments, determining the Vt shift amount includes using a statistical method to determine an overall shift of the interleaved reference cells.

In various embodiments, a read of a group of data cells on a selected word line is performed at the same time as corresponding interleaved reference cells on the selected word line are read. The read reference voltages used to perform the data read of the reference cells can be the same as read reference voltages used to read the data cells. However, embodiments are not so limited. That is, in some embodiments, the data cell and associated reference cell may be read at different times and/or different read reference voltages may be used to read the data cells.

At block 730, method 700 includes changing a state read from the at least one data cell based on a change of the at least one reference cell. In various embodiments, changing the state read from the at least one data cell includes changing the state read from the data cells to the target state if it is determined that the reference state is a state other than the target state. As described herein above, due to systematic disturb conditions, if the determined reference state, e.g., based on an averaging performed on a batch of read data cells, is a state other than the target state, e.g., an incorrect state, then a read performed on data cells programmed to that target state will likely also yield an incorrect state. In various embodiments of the present disclosure, a data correction and retrieval component, e.g., component 618 shown in FIG. 6, can perform averaging on the reference cells and can adjust the Vt levels of and/or change the read data states of the data cells based thereon. That is, the data cells programmed to the target state and read to store incorrect data can be corrected based on averaging performed on the associated reference cells.

Figure 8:
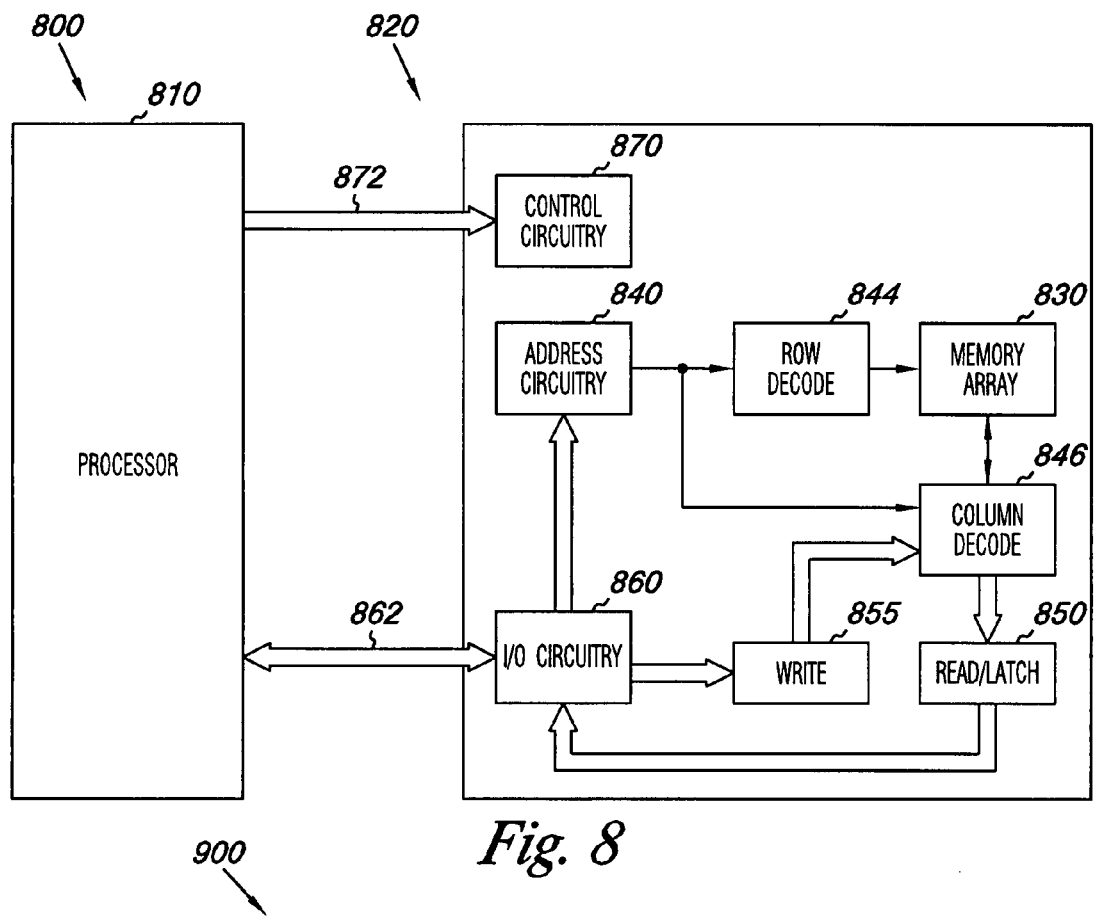
FIG. 8 is a functional block diagram of an electronic memory system having at least one memory device in accordance with an embodiment of the present disclosure.

FIG. 8 is a functional block diagram of an electronic memory system 800 having at least one memory device 820 in accordance with an embodiment of the present disclosure. Memory system 800 includes a processor 810 coupled to a non-volatile memory device 820 that includes a memory array 830 of non-volatile multilevel data cells and interleaved non-volatile multilevel reference cells as described herein above. The memory system 800 can include separate integrated circuits or both the processor 810 and the memory device 820 can be on the same integrated circuit. The processor 810 can be a microprocessor or some other type of controlling circuitry such as an application-specific integrated circuit (ASIC). The processor 810 can be a processor of an external host device, e.g., a digital camera, digital recording and playback device, PDA, personal computer, memory card reader, interface hub, etc.

For clarity, the electronic memory system 800 has been simplified to focus on features with particular relevance to the present disclosure. The memory device 820 includes an array of non-volatile multilevel memory cells 830, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 2. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 8 includes address circuitry 840 to latch address signals provided over I/O connections 862 through I/O circuitry 860. Address signals are received and decoded by a row decoder 844 and a column decoder 846 to access the memory array 830. In light of the present disclosure, it will be appreciated by those skilled in the art that the number of address input connections depends on the density and architecture of the memory array 830 and that the number of addresses increases with both increased numbers of memory cells and increased numbers of memory blocks and arrays.

The memory array 830 of non-volatile cells can include non-volatile multilevel memory cells programmed and read in various manners known to those of ordinary skill in the art. For example, the memory device 820 can read data in the memory array 830 by sensing voltage and/or current changes in the memory array columns using sense/buffer circuitry that, in this embodiment, can be read/latch circuitry 850. The read/latch circuitry 850 can be coupled to read and latch a row or sector of data from the memory array 830. I/O circuitry 860 is included for bi-directional data communication over the I/O connections 862 with the processor 810. Write circuitry 855 is included to write data to the memory array 830.

Control circuitry 870 decodes signals provided by control connections 872 from the processor 810. These signals can include chip signals, write enable signals, and address latch signals that are used to control the operations on the memory array 830, including data read, data write, and data erase operations. In various embodiments, the control circuitry 870 is responsible for executing instructions from the processor 810 to perform the operating embodiments of the present disclosure. The control circuitry 870 can be a state machine, a sequencer, or some other type of controller.

The control circuitry 870 can include data correction and retrieval circuitry, e.g., data correction circuitry 118 of FIG. 1, that can execute instructions to perform various data retrieval and correction methods to correct read data cells based on an averaging performed on reference cells interleaved therewith. It will be appreciated by those skilled in the art that additional circuitry and control signals can be provided, and that the memory device detail of FIG. 8 has been reduced to facilitate ease of illustration.

Figure 9:
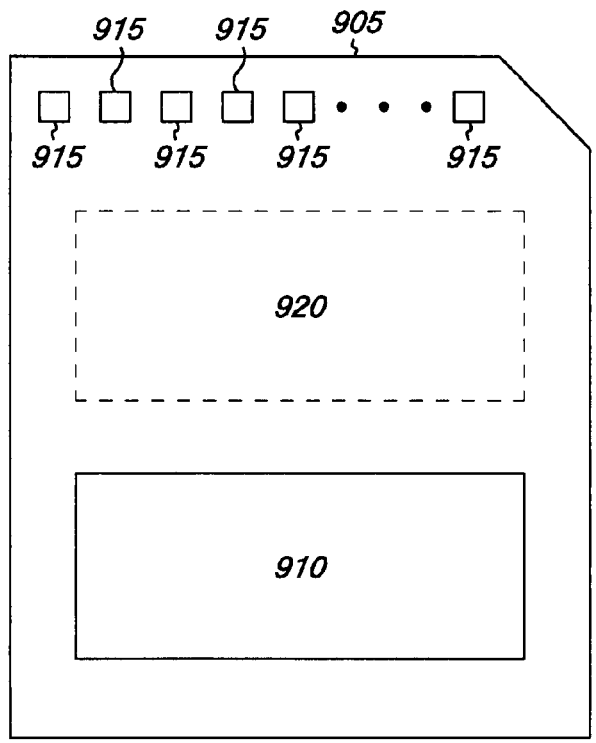
FIG. 9 is a functional block diagram of a memory module having at least one memory device in accordance with an embodiment of the present disclosure.

FIG. 9 is a functional block diagram of a memory module having at least one memory device in accordance with an embodiment of the present disclosure. Memory module 900 is illustrated as a memory card, although the concepts discussed with reference to memory module 900 are applicable to other types of removable or portable memory (e.g., USB flash drives) and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 includes an array of non-volatile multilevel memory cells programmed according to embodiments described herein. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 915 provide an interface for passing control, address and/or data signals between the memory module 900 and a host having compatible receptors for the contacts 915.

The memory module 900 may optionally include additional circuitry 920, which may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of 910 connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC. Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

Methods, devices, modules, and systems for non-volatile multilevel memory cell data retrieval with data read of reference cells. Embodiments use reference cells interleaved with data cells to compensate for various systematic and/or transient data degradation mechanisms have been described. One method embodiment includes programming at least one data cell of a number of data cells coupled to a selected word line to a target data threshold voltage (Vt) level corresponding to a target state; programming at least one reference cell of a number of reference cells coupled to the selected word line to a target reference Vt level, the number of reference cells interleaved with the number of data cells; determining a reference state based on a data read of the at least one reference cell; and changing a state read from the at least one data cell based on a change of the at least one reference cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of non-volatile multilevel memory cells, comprising:
    programming at least one data cell of a number of data cells coupled to a selected word line to a target data threshold voltage (Vt) level corresponding to a target state;
    programming at least one reference cell of a number of reference cells coupled to the selected word line to a target reference Vt level, the number of reference cells interleaved with the number of data cells;
    determining a reference state based on a data read of the at least one reference cell; and
    changing a state read from the at least one data cell based on a change of the at least one reference cell,
    wherein the reference state is obtained, based on a reference Vt level determined from the data read of the at least one reference cell, by comparing the reference Vt level with the target reference Vt level, and wherein the reference Vt level is an average Vt level of the at least one reference cell.

2. The method of claim 1, wherein the method includes programming the at least one data cell and the at least one interleaved reference cell to the same target Vt level.

3. The method of claim 1, wherein the method includes changing the state read from the at least one data cell to an appropriate state based on a difference between the determined reference state and a target reference state corresponding to the target reference Vt level.

4. The method of claim 1, wherein the method includes simultaneously programming the at least one data cell to the target data Vt level and the at least one interleaved reference cell to the target reference Vt level.

5. The method of claim 4, wherein the method includes:
    associating the number of reference cells with a particular target Vt level of a number of different target Vt levels, each Vt level corresponding to a different target state; and
    programming both the at least one data cells and the at least one interleaved reference cells to the particular target Vt level.

6. The method of claim 1, wherein the method includes performing the data read of the at least one reference cells at the same time as the state of the at least one data cells is read.

7. The method of claim 1, wherein the method includes performing the data read of the at least one reference cells at a different time than the state of the at least one data cells is read.

8. The method of claim 6, wherein the method includes using the same read conditions for reading the at least one data cells and the at least one interleaved reference cells.

9. The method of claim 1, wherein determining the reference state based on the data read of the at least one reference cells includes:
    determining a Vt shift amount, away from the target reference Vt level, associated with the at least one reference cells; and
    determining whether the Vt shift amount is sufficient such that the shifted Vt level corresponds to a state other than the target state.

10. The method of claim 9, wherein determining the Vt shift amount includes using a statistical method to determine an overall shift of the interleaved reference cells.

11. A method for operating an array of non-volatile multilevel memory cells, comprising:
    programming a number of data cells coupled to a selected word line to a target threshold voltage (Vt) level corresponding to a target state while programming a batch of reference cells coupled to the selected word line to the target Vt level;
    subsequently determining a Vt shift amount, away from the target Vt level, associated with the programmed batch of reference cells;
    performing a read operation to determine the state represented by the number of data cells; and
    changing the state represented by the number of data cells based on the determined Vt shift amount,
    wherein determining the Vt shift amount includes determining an average Vt shift associated with a statistically significant number of reference cells of the batch of reference cells.

12. The method of claim 11, wherein the method includes determining that the Vt shift amount away from the target Vt level alters the Vt level of the batch sufficiently such that the altered Vt level corresponds to a state other than the target state.

13. The method of claim 12, wherein the method includes correcting the determined state represented by the number of data cells such that the state represented by the number of data cells matches the target state.

14. The method of claim 11, wherein the method includes associating a number of different target Vt levels with a corresponding number of respective target states, and wherein the target Vt levels are the same for the reference cells of the batch and for the data cells.

15. The method of claim 11, wherein the method includes performing the read operation to determine the state represented by the number of data cells while performing a read operation to determine the state represented by the batch of reference cells.

16. The method of claim 15, wherein the method includes performing the read operations on the data cells and the reference cells by using the same read conditions for both the data cells and the reference cells.

17. The method of claim 11, wherein the method includes:
programming the number of data cells to a number of different Vt levels each corresponding to a different target state; and
programming a number of different batches of reference cells coupled to the selected word line, each batch of reference cells being programmed to a different Vt level of the number of different Vt levels each corresponding to the different target state.

18. A method for operating a NAND array of non-volatile multilevel memory cells, comprising:
programming a number of groups of data cells coupled to a selected word line, each group having an associated number of batches of reference cells interleaved therewith that are programmed and read at the same time as the respective group, wherein the data cells and reference cells have the same target threshold voltage (Vt) levels that correspond to the same target states;
performing a read operation on a particular group of data cells and on its associated batches of reference cells, each of the associated batches having been programmed to a different particular target state;
determining, based on the read operation, those batches of reference cells that represent a logic state other than the particular target state to which the batch was programmed; and
changing logic states represented by those data cells in the particular group that were programmed to one of the different particular target states corresponding to a batch of reference cells determined to represent the logic state other than the particular target state,
wherein determining those batches of reference cells that represent a logic state other than the particular target state includes determining an average Vt level associated with the read reference cells in each batch.

19. The method of claim 18, wherein changing logic states includes changing logic states from the logic state other than the particular target state to the particular target state.

20. The method of claim 18, wherein determining those batches of reference cells that represent a logic state other than the particular target state includes determining a most common logic state represented by the read reference cells in each batch.

21. A non-volatile memory device comprising:
an array of non-volatile multilevel memory cells arranged in rows coupled by word lines and columns coupled by bit lines, the rows including:
a number of data cells having an associated number of target threshold voltage (Vt) levels which correspond to a number of target states; and
a number of batches of reference cells interleaved with the data cells, the reference cells having the same target Vt levels and target states as the data cells; and
control circuitry coupled to the array of memory cells and configured to execute a method that includes:
programming a group of data cells and an associated batch of reference cells coupled to a selected word line to a particular target Vt level corresponding to a particular target state;
performing a data read operation on the group of data cells and the associated batch of reference cells;
obtaining a reference state associated with the batch of reference cells based on the data read operation;
if the reference state is a data state other than the particular target state, changing the state of the data cells to the particular target state,
wherein the reference state is obtained, based on a reference Vt level associated with the Vt levels of the batch of reference cells determined from the data read operation, by comparing the reference Vt level with the target Vt level, and wherein the reference Vt level is an average of the Vt levels of the reference cells in the batch.

22. The device of claim 21, wherein each batch of reference cells includes at least four reference cells.

23. The device of claim 22, wherein the group of data cells has a number of associated batches of reference cells, each batch corresponding to a different target state, and wherein the number of associated batches is the same as the number of different target states.

24. A non-volatile memory device comprising:
a NAND array of non-volatile multilevel memory cells arranged in rows coupled by word lines and columns coupled by bit lines, the rows including:
a number of data cells; and
a number of batches of reference cells interleaved with the data cells, the reference cells in each batch having the same target threshold voltage (Vt) levels and corresponding target states as the data cells; and
control circuitry coupled to the array of memory cells and configured to execute a method that includes:
programming a group of data cells coupled to a selected word line to a number of different target states while programming a number of the batches of reference cells associated with the group to the number of different target states, each programmed batch corresponding to a different target state;
reading the batches of reference cells associated with the group and determining a particular reference state associated with each batch while reading the group of data cells and determining a particular data state associated with each data cell; and
if the determined particular reference state associated with a batch is different than a particular target state to which the reference cells of the batch were programmed, changing the determined particular data state of data cells whose determined particular data state is the particular reference state,
wherein determining the particular reference state associated with each batch of reference cells associated with the group of data cells includes comparing an average read Vt level of each of the batches with the target Vt level corresponding to the particular target state to which the reference cells of the batch were programmed.

25. The device of claim 24, wherein each word line has a number of different groups of data cells that are simultaneously programmed and read and each different group has a corresponding number of batches of reference cells interleaved with the respective group of data cells.

26. The device of claim 25, wherein the group of data cells corresponds to a first page of data and wherein the selected word line includes a second group of data cells corresponding to a second page of data.

27. The device of claim 25, wherein the same reference read levels are used to read the batches of reference cells associated with the group and to read the group of data cells.

28. The device of claim 24, wherein each data cell and each reference cell is a four-bit cell multilevel memory cell capable of representing sixteen different logic states.

29. The device of claim 24, wherein the method includes:
changing the determined particular data state of data cells whose determined particular data state is the particular reference state by using a data correction circuit coupled to the array; and
providing the changed data state to an external host coupled to the control circuitry.

30. A non-volatile memory controller comprising:
a control circuit coupled to a host interface;
a memory device interface for one or more non-volatile memory devices coupled to the controller, wherein the non-volatile memory devices each include an array of non-volatile multilevel memory cells arranged in rows coupled by word lines and columns coupled by bit lines, the rows including:
    a number of data cells; and
    a number of batches of reference cells interleaved with the data cells, the reference cells having the same target Vt levels and corresponding target states and reference read voltages as the data cells;
wherein the control circuit is configured to:
    program a selected group of data cells to a number of different target states while programming a number of the batches associated with the selected group to the number of different target states, each batch corresponding to a particular target state;
    read the batches of reference cells associated with the selected group while reading the group of data cells; and
data correction circuitry configured to:
    based on the read of the batches, determine a particular reference state associated with each batch of reference cells; and
    if the particular reference state associated with a batch is a state other than the particular target state to which the reference cells of the batch were programmed, changing the data stored in data cells that were read as being programmed to the particular reference state to the particular target state;
wherein each particular reference state is obtained, based on a reference Vt level associated with Vt levels of a respective batch of reference cells determined from the read of the respective batch of reference cells, by comparing the reference Vt level with the target Vt level, and wherein the reference Vt level is an average of the Vt levels of the reference cells in the respective batch.

* * * * *

UNITED STATES PATENT AND TRADEMARK OFFICE
CERTIFICATE OF CORRECTION

PATENT NO. : 7,577,036 B2  Page 1 of 1
APPLICATION NO. : 11/799658
DATED : August 18, 2009
INVENTOR(S) : Vishal Sarin et al.

It is certified that error appears in the above-identified patent and that said Letters Patent is hereby corrected as shown below:

In column 22, line 33, in Claim 23, delete "22," and insert -- 21, --, therefor.

Signed and Sealed this

Thirteenth Day of October, 2009

David J. Kappos
*Director of the United States Patent and Trademark Office*